United States Patent
Im et al.

(10) Patent No.: US 7,663,311 B2
(45) Date of Patent: Feb. 16, 2010

(54) ORGANIC LIGHT EMITTING DISPLAY (OLED) DEVICE AND METHOD OF FABRICATING THE SAME

(75) Inventors: Choong-Youl Im, Suwon-si (KR); Kyung-Jin Yoo, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 348 days.

(21) Appl. No.: 11/892,008

(22) Filed: Aug. 17, 2007

(65) Prior Publication Data
US 2008/0224600 A1 Sep. 18, 2008

(30) Foreign Application Priority Data
Mar. 16, 2007 (KR) .................... 10-2007-0026187

(51) Int. Cl.
*H01J 1/62* (2006.01)
(52) U.S. Cl. ...................... 313/509; 313/503
(58) Field of Classification Search ......... 313/498–512; 315/169.3, 169.4; 257/40, 79; 428/690
See application file for complete search history.

(56) References Cited

U.S. PATENT DOCUMENTS

| | | | | |
|---|---|---|---|---|
| 5,294,869 A * | 3/1994 | Tang et al. | ............... | 313/504 |
| 5,396,084 A * | 3/1995 | Matsumoto | ............... | 257/72 |
| 7,439,539 B2 * | 10/2008 | Jeoung et al. | ............... | 257/59 |
| 7,545,097 B2 * | 6/2009 | You | ............... | 313/506 |

| | | | | |
|---|---|---|---|---|
| 2002/0149054 A1 * | 10/2002 | So et al. | ............... | 257/347 |

FOREIGN PATENT DOCUMENTS

| KR | 10-2001-0039733 | 5/2001 |
|---|---|---|
| KR | 10-2005-0049693 | 5/2005 |
| KR | 10-2005-0051076 | 6/2005 |
| KR | 10-2006-0037730 | 5/2006 |

OTHER PUBLICATIONS

*Registration Determination Certificate* from the Korean Patent Office issued in Applicant's corresponding Korean Patent Application No. 2007-0026187 dated Apr. 23, 2008.

* cited by examiner

*Primary Examiner*—Peter Macchiarolo
(74) *Attorney, Agent, or Firm*—Robert E. Bushnell, Esq.

(57) ABSTRACT

An organic light emitting display (OLED) device having a simple process of fabrication and improved lifetime and reliability, and a method of fabricating the same are disclosed. The OLED device comprises: a substrate; a sealing member which seals a plurality of pixels arranged on a pixel region; and a sealing material which bonds the substrate and the sealing member. Each of the pixels includes a thin film transistor disposed on the substrate, an EL device including a lower electrode connected to the thin film transistor, a pixel isolation layer exposing a portion of the lower electrode, an organic layer formed on at least the exposed portion of the lower electrode, and an upper electrode. A pad interconnection line of a pad interconnection region is covered by a first insulating layer, and a pad of a pad region is covered by a second insulating layer so as to expose a portion of the pad. The first insulating layer and the second insulating layer are formed of the same material as a lower layer of the pixel isolation layer.

16 Claims, 6 Drawing Sheets

ORGANIC LIGHT EMITTING DISPLAY (OLED) DEVICE AND METHOD OF FABRICATING THE SAME

CLAIM OF PRIORITY

This application makes reference to, incorporates the same herein, and claims all benefits accruing under 35 U.S.C. §119 from an application for OLED AND METHOD OF FABRICATING THE SAME earlier filed in the Korean Intellectual Property Office on the 16 of Mar. 2007 and there duly assigned Serial No. 10-2007-0026187.

BACKGROUND OF THE INVENTION

1. Technical Field

The present invention relates to a flat panel display device and, more particularly, to an organic light emitting display (OLED) device in which an inorganic passivation layer is disposed under a pixel isolation layer, and a method of fabricating the same.

2. Related Art

Organic light emitting display (OLED) devices are self-emitting display devices which include a plurality of pixels arranged in a display region. Each pixel includes at least one switching transistor, a driving transistor, a capacitor and an EL device. The EL device includes an anode electrode, a cathode electrode, and an organic layer having a light emitting layer and interposed between the anode and cathode electrodes.

Organic light emitting display (OLED) devices are classified into bottom emitting OLED devices and top emitting OLED devices according to the direction of light emitted from the light emitting layer of an EL device in a pixel arranged in a pixel region. In a top emitting structure, light emitted from an organic light emitting layer of a pixel is extracted from the opposite direction to a TFT array substrate in which the pixel is arranged, and in a bottom emitting structure, light is extracted through a TFT array substrate in which the pixel is arranged. The top emitting structure has a higher aperture ratio than the bottom emitting structure.

Conventionally, an OLED device is fabricated by forming a thin film transistor, including a gate, a semiconductor layer and source/drain electrodes, on a substrate, forming a passivation layer and/or a planarization layer on the substrate including the thin film transistor, and forming an organic EL device, including an anode electrode, an organic light emitting layer, and a cathode electrode, on the passivation layer. The emission characteristics of the organic EL device, such as brightness and uniformity, deteriorate dramatically after the organic EL device is driven for a predetermined time, thereby decreasing reliability. Factors which decrease the reliability of the organic EL device may be moisture, oxygen, and other contaminants which permeate into the organic EL device.

A passivation layer is required under a sealing member to lengthen the lifetime of an organic EL device, and to prevent failure of a pad in OLED devices. In conventional OLED devices, a passivation layer is formed between a thin film transistor and an anode electrode, and an opening is formed to expose a pad. Accordingly, the process for manufacturing conventional OLED devices is complicated, since mask processes are needed to form an opening for the passivation layer and to form an opening for a pixel isolation layer.

SUMMARY OF THE INVENTION

The present invention provides an organic light emitting display (OLED) device, the fabrication process of which is simplified by forming a passivation layer and a pixel isolation layer using a single mask process, thereby providing an organic EL device with a long lifetime and preventing pad failures, and a method of fabricating the same.

According to an aspect of the present invention, an OLED device comprises: a substrate including a pixel region in which a plurality of pixels are arranged, a pad region in which a plurality of pads are arranged to transmit signals received from the outside, and a pad interconnection region in which a plurality of pad interconnection lines are arranged to transmit the signals from the pads to the pixels; a sealing member which seals the plurality of pixels arranged on the pixel region; and a sealing material which bonds the substrate and the sealing member. Each of the pixels includes a thin film transistor disposed on the substrate, and an organic EL device including a lower electrode connected to the thin film transistor, a pixel isolation layer exposing a portion of the lower electrode, an organic layer formed at least on the exposed region of the lower electrode, and an upper electrode. The pixel isolation layer includes a laminated structure of a lower layer and an upper layer. The pad interconnection line of the pad interconnection region is covered by a first insulating layer, and the pad of the pad region is covered by a second insulating layer to expose a portion of the pad. The first insulating layer and the second insulating layer are formed of the same material as the lower layer of the pixel isolation layer.

The lower layer of the pixel isolation layer may include an inorganic insulating layer, such as a silicon nitride layer. The upper layer of the pixel isolation layer may include an organic insulating layer, such as polyimide, polyamide, BCB or SOG. The sealing material may include a frit or a sealant.

The sealing material is disposed on at least a portion of the pad interconnection region, and may be disposed on a portion of the second insulating layer on the pad interconnection line.

According to another aspect of the present invention, there is provided a method of fabricating an OLED device. First, a substrate including a pixel region in which a plurality of pixels are arranged, a pad region and a pad interconnection region are prepared. A thin film transistor in each of the pixels is formed in the pixel region, a pad is formed on the pad region, and a pad interconnection line is formed on the pad interconnection region. A lower electrode, connected to a thin film transistor, is formed on the pixel region. Through a single mask process, a pixel isolation layer including a first opening exposing a portion of the lower electrode is formed on the pixel region, a first insulating layer is formed on the pad interconnection region to insulate the pad interconnection lines, and a second insulating layer including a second opening exposing portions of the pads is formed on the pad region to insulate the pads. An organic layer, including at least a light emitting layer, is formed on an exposed lower electrode of the pixel region. An upper electrode is formed on the pixel region. The plurality of pixels on the substrate are sealed by a sealing member using a sealing material.

The pixel isolation layer includes a laminated structure of a lower layer and an upper layer, and the first insulating layer and the second insulating layer are formed of the same material as the lower layer of the pixel isolation layer. The first and second insulating layers and the lower layer may include an inorganic insulating layer, such as a silicon nitride layer.

The forming of the pixel isolation layer and the first and second insulating layers comprises forming a lower insulating layer and an upper insulating layer on the substrate. Then, a first upper insulating layer pattern including an opening is formed on the pixel region, a second upper insulating layer pattern is formed on the pad interconnection region, and a third upper insulating layer pattern including an opening is formed on the pad region by patterning the upper insulating layer using a halftone mask. A first lower insulating layer pattern including an opening is formed on the pixel region, a second lower insulating layer pattern is formed on the pad interconnection region, and a third lower insulating layer pattern including the second opening is formed on the pad region by etching the lower insulating layer using the first to third upper insulating layer patterns as a mask. The openings in the first upper insulating layer pattern and the first lower insulating layer pattern form the first opening. The second and third insulating layer patterns are removed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
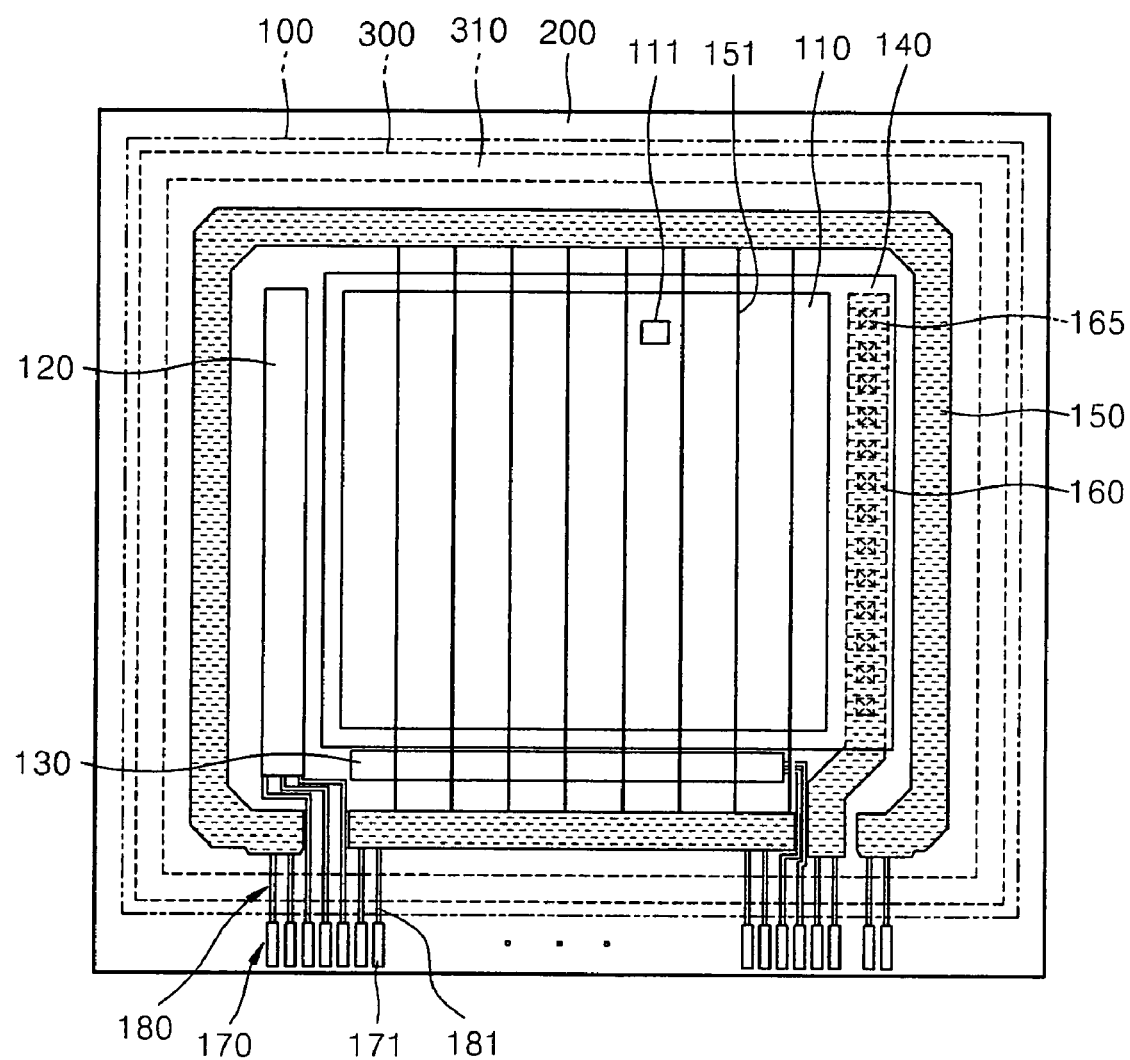
FIG. 1 is a schematic plan view of an organic light emitting display (OLED) device according to an embodiment of the present invention.

FIG. 1 is a schematic plan view of an organic light emitting display (OLED) device according to an embodiment of the present invention.

Referring to FIG. 1, the OLED device includes a lower substrate 200 which is a TFT array substrate containing TFT arrays, and an upper substrate 100 which is a sealing member for sealing the lower substrate 200. The lower substrate 200 and the upper substrate 100 are bonded to each other by a sealing material 310 applied to a sealing unit 300 along the dotted line shown in FIG. 1. The sealing material 310 may include a sealant or frit. A top emitting OLED device uses a transparent glass substrate as the upper substrate 100, and a bottom emitting OLED device may use a metal cap as the upper substrate 100. Furthermore, a film sealing member or the like may be used rather than the upper substrate 100.

A plurality of pixels 111, including R, G, and B unit pixels, is arranged on a pixel region 110 of the lower substrate 200 in a matrix. Although not shown in FIG. 1, each of the R, G, and B unit pixels of the pixels 111 arranged on the pixel region 110 includes at least a switching transistor which switches data signals, a driving transistor which generates driving currents corresponding to the data signals, a capacitor which stores the data signals, and an EL device operated by the driving currents to display an image.

The OLED device includes a gate driver 120 which provides scan signals to the pixel 111, a data driver 130 which provides the data signals to the pixel 111, and a cathode bus line 160. The cathode bus line 160 is connected through contacts 165 to a cathode electrode 140, which is a surface electrode formed in correspondence to the pixel region 110. The cathode bus line 160 provides a cathode voltage, received from the outside through the pad 171 arranged on the pad region 170, to the cathode electrode 140.

Furthermore, the OLED device includes a driving power interconnection region 150 to provide a driving voltage Vdd to the pixels arranged on the pixel region 110. The driving power interconnection region 150 includes a plurality of driving power lines 151 for providing the driving voltage to the pixels, and is located on an outer portion of the pixel region 110.

A plurality of pads 171 is arranged on a pad region 170 of the lower substrate 200, and the respective pads 171 transmit signals received from the outside to the driving power interconnection region 150, the gate driver 120, the data driver 130 and the cathode bus line 160. Furthermore, a plurality of pad interconnection lines 181 is arranged on the pad interconnection region 180 of the lower substrate 200 to connect the pad 171 to the driving power interconnection region 150, the gate driver 120, the data driver 130 and the cathode bus line 160.

Figure 2:
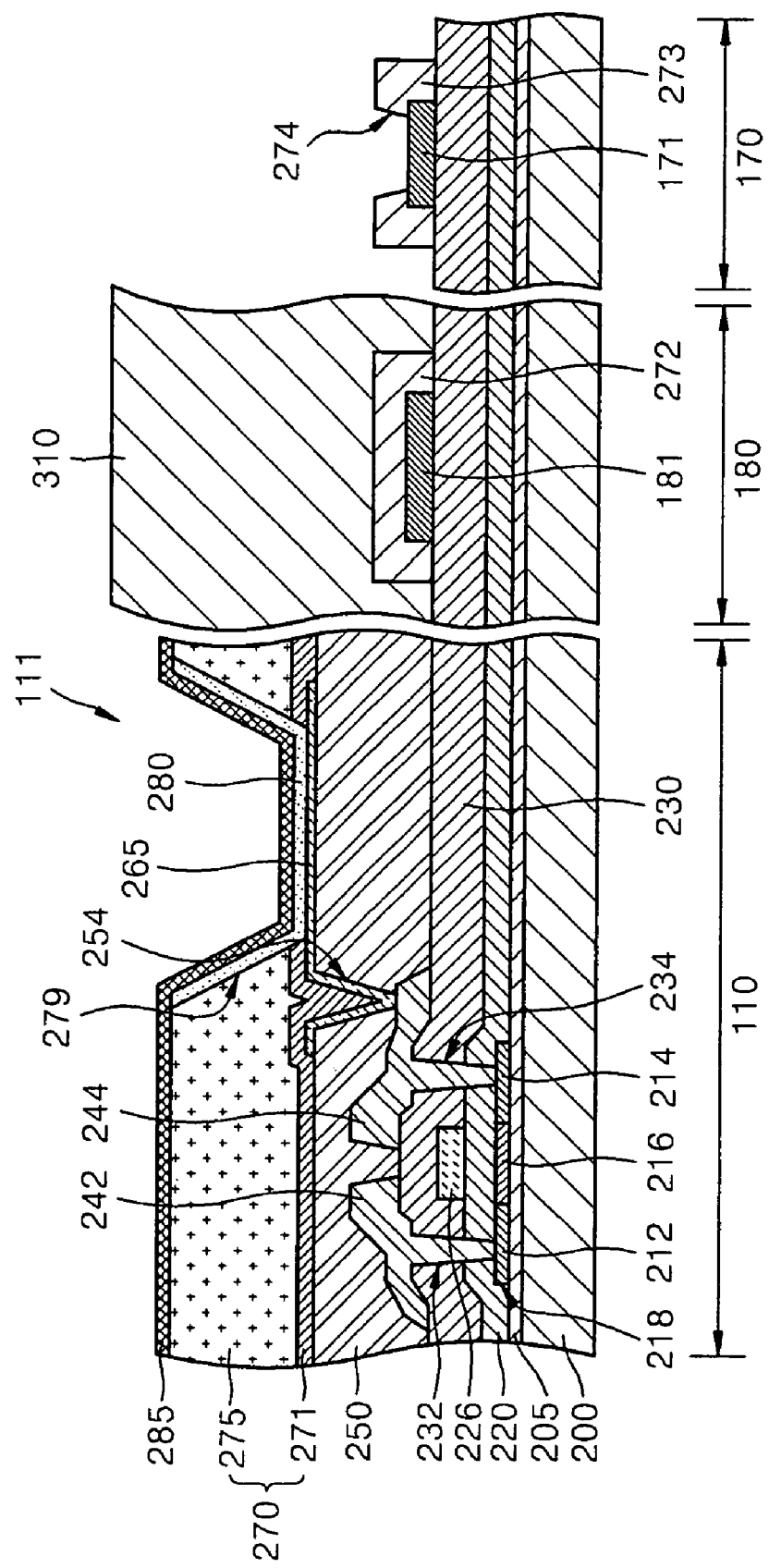
FIG. 2 is a schematic cross-sectional view of a pixel region, a pad interconnection region and a pad region of the OLED device according to an embodiment of the present invention.

FIG. 2 is a schematic cross-sectional view of a pixel region, a pad interconnection region and a pad region of an OLED device according to an embodiment of the present invention.

In FIG. 2, reference numerals 110, 180 and 170 represent the pixel region, the pad interconnection region and the pad region, respectively, of FIG. 1. FIG. 2 shows cross-sectional views of an R, G, or B unit pixel of a pixel 111 arranged on the pixel region 110, a pad interconnection line 181 arranged on the pad interconnection region 180, and a pad 171 arranged on the pad region 170.

Further referring to FIG. 2, in the pixel region 110, a buffer layer 205 is formed on the lower substrate, and a thin film transistor includes a semiconductor layer 218 having source and drain regions 212 and 214 and a channel region 216, a gate 226 formed on a gate insulating layer 220, and source and drain electrodes 242 and 244 connected through contact holes 232 and 234 to the source and drain regions 212 and 214, respectively, formed on an interlevel dielectric layer 230 on the buffer layer 205. The semiconductor layer 218 includes a silicon layer, such as an amorphous silicon or polycrystalline silicon layer. A silicon thin film transistor is illustrated as the thin film transistor in this embodiment of the present invention, but any organic thin film transistor which uses an organic semiconductor layer can be used. The structure of the thin film transistor is not limited to the top gate type.

An organic EL device is formed on a planarization layer 250. That is, an anode electrode 265 which is connected through a via hole 254 to the drain electrode 244 is formed on the planarization layer 250. A pixel isolation layer 270, which includes an opening 279 through which a portion of an anode electrode 265 is exposed, is formed on the planarization layer 250. The pixel isolation layer 270 includes a lower layer 271 and an upper layer 275. The lower layer 271 may include an inorganic insulating layer such as a silicon nitride layer. The upper layer 275 may include an organic insulating layer, such as polyimide, polyamide, BCB or SOG.

A top emitting OLED device may include the planarization layer 250 between the thin film transistor and the anode electrode 265. A bottom emitting OLED device may not include the planarization layer 250. Accordingly, the anode electrode 265 may be formed on the interlevel dielectric layer 230 and directly connected to the drain electrode 244 without using via hole 254, and the pixel isolation layer 270 may be formed on the interlevel dielectric layer 230 so as to expose a portion of the anode electrode 265.

An organic layer 280 is formed on the anode electrode 265 in the opening 279. The organic layer 280 includes one organic layer comprising a hole injection layer, a hole transport layer, an R, G or B organic light emitting layer, an electron transport layer, an electron injection layer, or a hole blocking layer. In an embodiment of the present invention, only the organic layer 280 formed in the opening 279 of the pixel isolation layer 270 is illustrated. However, a carrier transport layer, such as the hole injection layer, the hole transport layer, the electron transport layer, the electron injection layer, the electron injection layer and the hole blocking layer, may be formed throughout the pixel region 110. A cathode electrode 285 is formed on the pixel region 110 as a surface electrode.

In a bottom emitting OLED device, the anode electrode 265 may include a transparent electrode, and the cathode electrode 285 may include a reflective electrode. The anode electrode 265 may include a transparent conductive material such as ITO, IZO, ZnO, or $In_2O_3$, and the cathode electrode 285 may include Li, Ca, LiF/Ca, LiF/Al, Al, Mg or a compound thereof. Meanwhile, in a top emitting OLED device, the anode electrode 265 may include a reflective electrode which includes a laminated structure of a transparent conductive layer and a reflective layer. The anode electrode 265 may include ITO, IZO, ZnO, $In_2O_3$ or the like as the transparent conductive layer, and may include a metal having excellent reflectivity such as Ag, Mg, Al, Pt, Pd, Au, Ni, Nd, Ir, Cr or a compound thereof as the reflective layer. The cathode electrode 285 comprises a transparent electrode which includes a laminated structure of a metal layer and a transparent conductive layer. The metal layer for the cathode electrode 285 may include Li, Ca, LiF/Ca, LiF/Al, Al, Mg or a compound thereof, and the transparent conductive layer for the cathode electrode 285 may include ITO, IZO, ZnO, $In_2O_3$ or the like.

Meanwhile, in the pad interconnection region 180, the buffer layer 205, the gate insulating layer 220 and the interlevel dielectric layer 230 are formed on the lower substrate 200, the pad interconnection line 181 is formed on the interlevel dielectric layer 230, and the first insulating layer 272 is formed on the interlevel dielectric layer 230 so as to cover the pad interconnection line 181. Only the pad interconnection line 181 arranged on the interlevel dielectric layer 230 is illustrated in this embodiment of the present invention. However, the pad interconnection line 181 can be formed on the buffer layer 205 or the gate insulating layer 230. The pad interconnection line 181 may include at least one of the electrode materials of the thin film transistor. The pad interconnection line 181 has a single layer in an embodiment of the present invention, but may have multiple layers. The first insulating layer 272 is formed of the same material as the lower layer 271. The first insulating layer 272 may include an inorganic insulating layer, such as a silicon nitride layer. The sealing material 310 is applied to the first insulating layer 272 and the interlevel dielectric layer 230.

In the pad region 170, the buffer layer 205, the gate insulating layer 220 and the interlevel dielectric layer 230 are formed on the lower substrate 200, the pad 171 is formed on the interlevel dielectric layer 230, and the second insulating layer 273 is formed on the interlevel dielectric layer 230 so as to cover the pad 171. Only the pad 171 arranged on the interlevel dielectric layer 230 is illustrated in this embodiment of the present invention. However, the pad 171 may be formed on the buffer layer 205 or the gate insulating layer 230. The pad 171 may include at least one of the electrode materials of the thin film transistor. The pad 171 has a single layer, but may have multiple layers. The second insulating layer 273 is formed of the same material as the lower layer. The second insulating layer 273 may include an inorganic insulating layer, such as a silicon nitride layer. The second insulating layer 273 includes an opening 274 which exposes a portion of the pad 171.

FIGS. 3A thru 3G are schematic cross-sectional views illustrating a method of fabricating the OLED device according to an embodiment of the present invention.

Figure 3A:
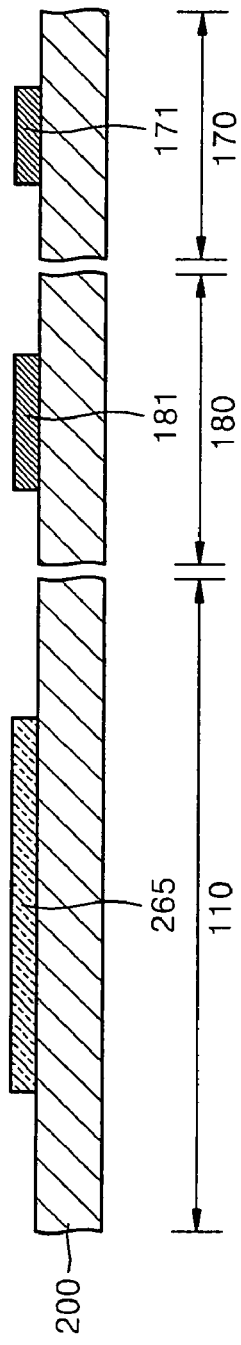
FIGS. 3A thru 3G are schematic cross-sectional views of a pixel region, a pad interconnection region and a pad region of an OLED device, illustrating a method of fabricating the OLED device according to an embodiment of the present invention.

Referring to FIG. 3A, a lower substrate 200 is prepared. The lower substrate 200 includes a pixel region 110, a pad interconnection region 180, and a pad region 170. Although not shown in FIG. 3A of the drawings, a thin film transistor, including a semiconductor layer 218 formed on a buffer layer 205, a gate 226 formed on a gate insulating layer 220, and source and drain electrodes 242 and 244 formed on an interlevel dielectric layer 230, is formed on the pixel region 110 as illustrated in FIG. 2. A planarization layer 250 is formed on the lower substrate 200 including the thin film transistor, and an anode electrode 265 is formed on the planarization layer 250 and is connected, through a via hole 254, to a drain electrode 244.

Meanwhile, in a pad interconnection region 180, a pad interconnection line 181 is formed on the lower substrate 200 when the gate 226, the source and drain electrodes 242 and 244, and/or the anode electrode 265 of the thin film transistor are formed. The buffer layer 205, the gate insulating layer 220, the interlevel dielectric layer 230, and the like can be arranged between the pad interconnection line 181 and the lower substrate 200.

Furthermore, in a pad region 170, a pad 171 is formed on the lower substrate 200 when the gate 226, the source and drain electrodes 242 and 244, and/or the anode electrode 265 of the thin film transistor are formed. The buffer layer 205, the gate insulating layer 220, the interlevel dielectric layer 230, and other layers can be arranged between the pad 171 and the lower substrate 200. The pad 171 can be formed of the same material as the pad interconnection line 181.

Figure 3B:
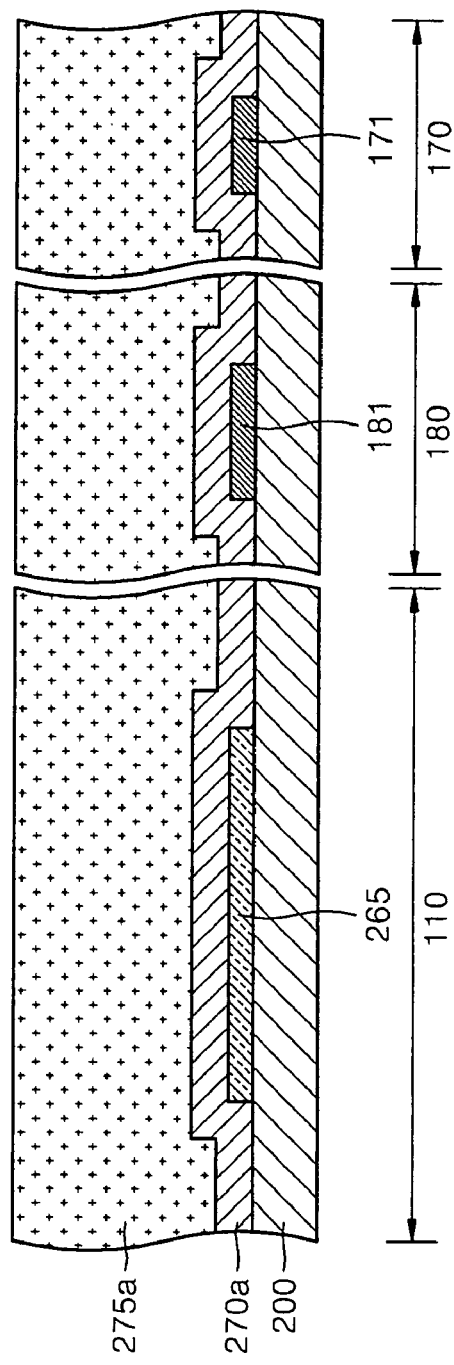

Referring to FIG. 3B, an inorganic insulating layer 270a and an organic insulating layer 275a are sequentially formed on a lower substrate 200, including an anode electrode 265 on a pixel region 110, a pad interconnection line 181 on a pad interconnection region 180, and a pad 171 on a pad region 170. The inorganic insulating layer 270a may include a silicon nitride layer. The organic insulating layer 275a may include polyimide, polyamide, BCB, SOG, or the like.

Figure 3C:
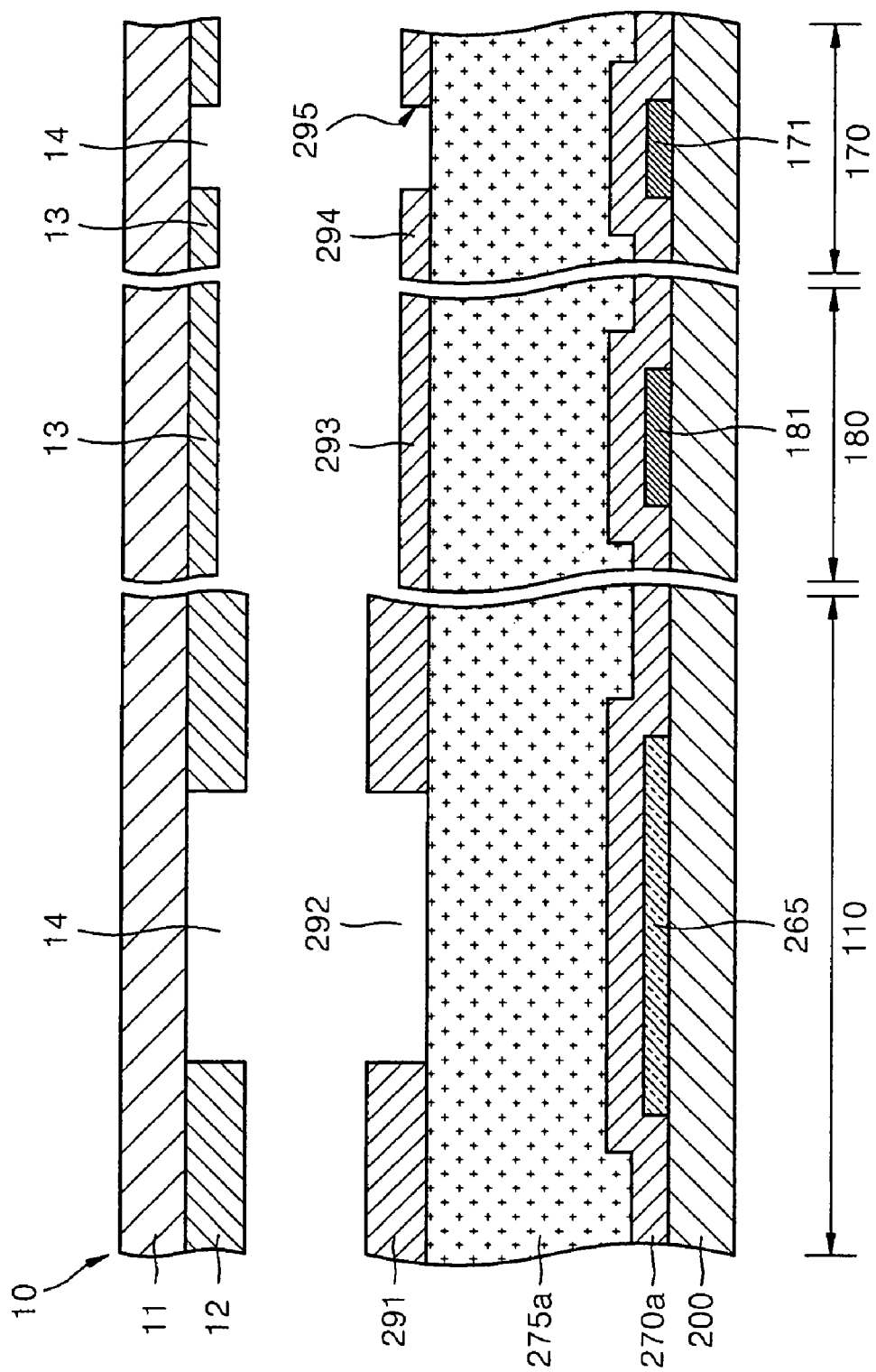

Referring to FIG. 3C, a photosensitive layer is coated on an organic insulating layer 275a, and is patterned using a halftone mask 10. The halftone mask 10 includes a substrate 11, and a non-transparent pattern 12, a semi-transparent pattern 13 and an opening region 14 which are arranged on the substrate 11. The non-transparent pattern 12 does not transmit light, and is aligned with the pixel region 110. The semi-transparent pattern 13 partially transmits light, and is aligned with the pad interconnection region 180 and a portion of the pad region 170. The opening region 14 transmits all light, and is aligned with a portion in which the anode electrode 165 on the pixel region 110 is exposed, and a portion in which the pad 171 on the pad region 170 is exposed.

Accordingly, when the photosensitive layer is patterned using the halftone mask 10, a first photosensitive layer pattern 291, a second photosensitive layer pattern 293 and a third photosensitive layer pattern 294 are formed. The first photosensitive layer pattern 291 is arranged on the pixel region 110 so as to have an opening 292 corresponding to the anode electrode 265 at which the organic insulating layer 275a is completely removed during the following etching process, and the remnant portion of the first photosensitive layer pattern 291, other than the opening 292, has a first thickness in which the organic insulating layer 275a is not etched. The second photosensitive layer pattern 293 is arranged on the pad interconnection region 180 so as to have a second thickness which is less than the first thickness, in which the organic insulating layer 275a is partially etched during the following etching process. The third photosensitive layer pattern 294 is arranged on the pad region 170 so as to have an opening 295 corresponding to a portion of the pad 171 to be exposed and at which the organic insulating layer 275a is completely removed during the following etching process, and the remnant portion of the third photosensitive layer pattern 294, other than the opening 295, has the second thickness in which the organic insulating layer 275a is partially etched.

Figure 3D:
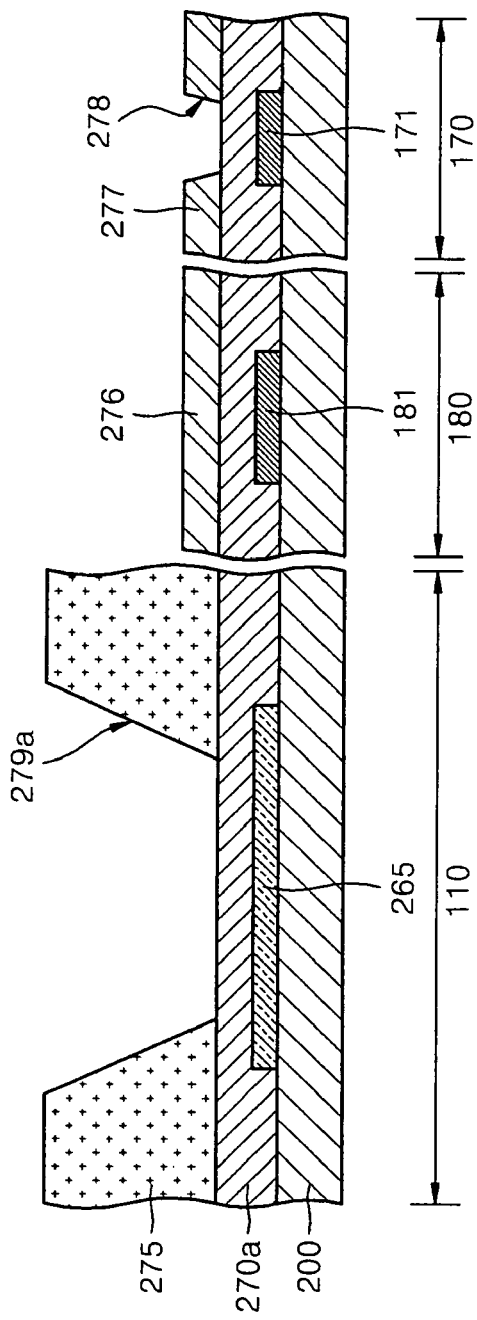

Referring to FIG. 3D, the organic insulating layer 275a is patterned using first to third photosensitive layer patterns 291, 293 and 294, respectively, such that a first organic insulating layer pattern 275 including an opening 279a is formed to expose an inorganic insulating layer 270a corresponding to the anode electrode 265 on the pixel region 110, a second organic insulating layer pattern 276 is formed on the pad interconnection region 180, and a third organic layer pattern 277 including an opening 278 to the inorganic insulating layer 270a corresponding to the pad 171 on the pad region 170.

Figure 3E:
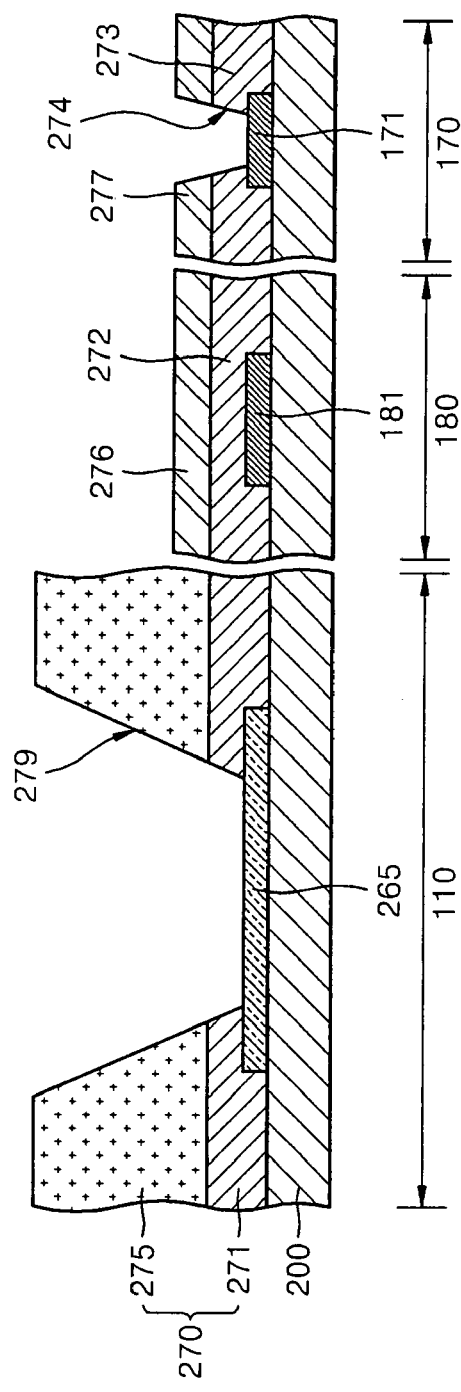

Referring to FIG. 3E, a pixel isolation layer 270 including an opening 279 is formed on a pixel region 110 by etching an exposed inorganic insulating layer 270a using the first to third organic insulating layer patterns 275, 276, and 277, respectively, as a mask. The pixel isolation layer 270 includes the first inorganic insulating layer pattern 271 and the first organic insulating layer pattern 275, and the opening 279 is formed over the first inorganic insulating layer pattern 271 and the first organic insulating layer pattern 275 so as to expose a portion of the anode electrode 265. Furthermore, a second inorganic insulating layer pattern 272 is formed in the pad interconnection region 180 so as to cover the pad interconnection line 181, and the third inorganic insulating layer pattern 273 including an opening 274 exposing a portion of the pad 171 is formed on the pad region 170.

Figure 3F:
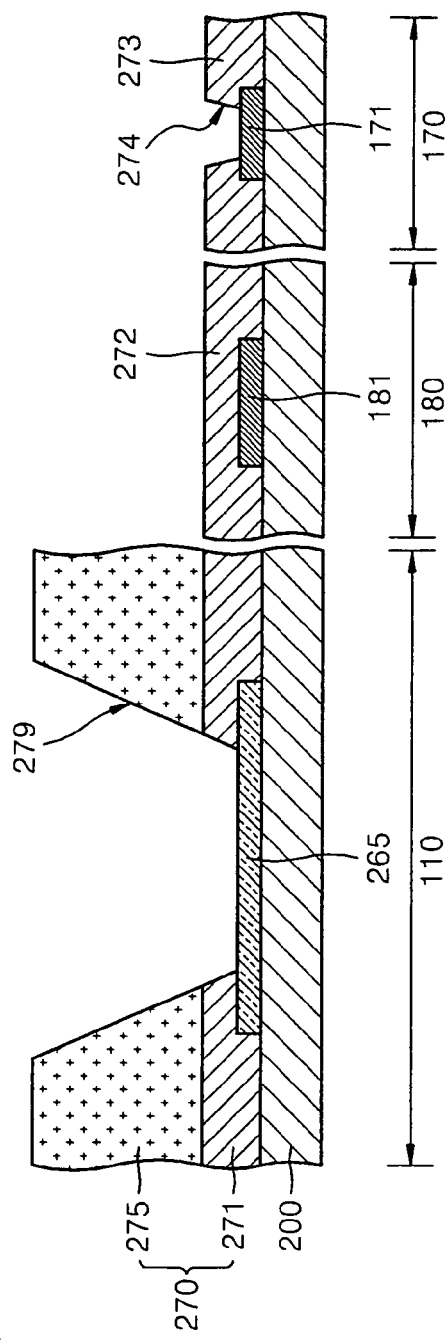

Referring to FIG. 3F, the second organic insulating layer pattern 276 of the pad interconnection region 180 and the third organic insulating layer pattern 277 of the pad region 170 are removed by $O_2$ ashing, chemical etching, exposure and developing, or the like. In this regard, the first organic insulating layer pattern 275 of the pixel region 110 may be partially etched. Accordingly, the thickness of the organic insulating layer 275a can be determined by considering the etched amount illustrated in FIG. 3F during the organic insulating layer formation illustrated in FIG. 3B.

Figure 3G:
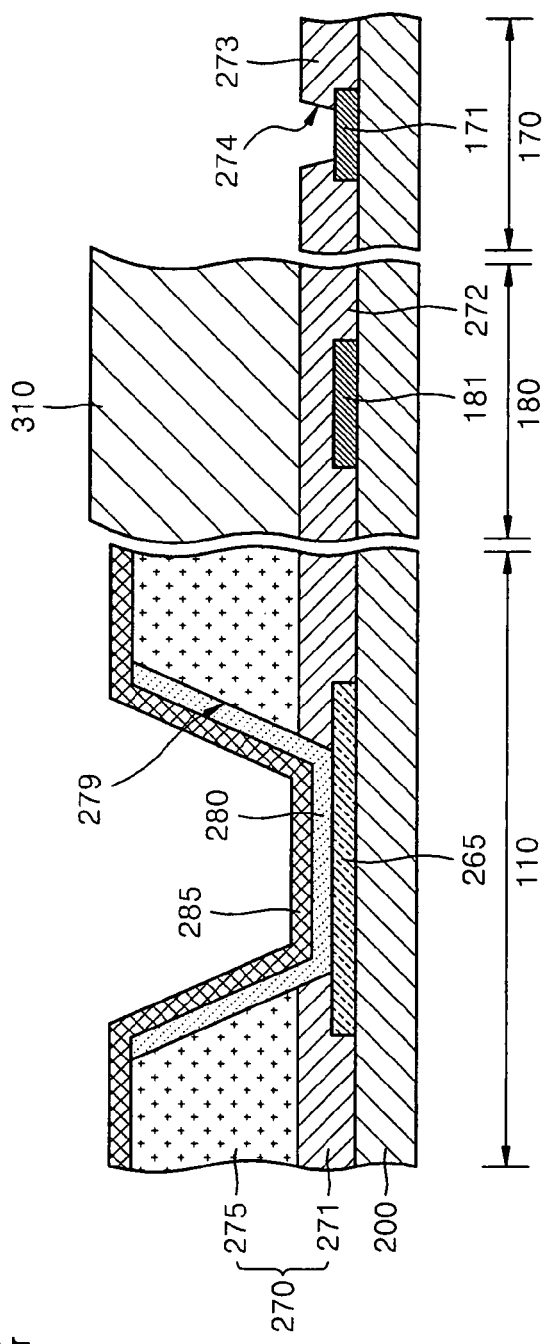

Referring to FIG. 3G, an organic layer 280 and a cathode electrode 285 are formed on the pixel region 110. Then, a sealing material 310 is applied to a region of the second inorganic insulating layer pattern 272 corresponding to a sealing unit 300 on the pad interconnection region 180. An upper substrate 100 is then bonded as illustrated in FIG. 1 to seal pixels 111 in the pixel region 110 of the upper and lower substrates 100 and 200, respectively. The sealing material 310 may include a sealant or frit. As a result, the OLED device is fabricated.

According to embodiments of the present invention, a pixel isolation layer including an inorganic insulating layer and an organic insulating layer, and an inorganic layer for insulating pads and pad interconnection lines, are formed using a single mask process so that the process is simplified. By forming a passivation layer comprising a nitride layer is formed between an anode electrode and a sealing member, an EL device can have a long lifetime and excellent reliability, and pad failures can be avoided.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light emitting display device, comprising:
   a substrate including a pixel region in which a plurality of pixels is arranged, a pad region in which a plurality of pads is arranged to transmit signals received from outside, and a pad interconnection region in which a plurality of pad interconnection lines is arranged to transmit the signals from the pads to the pixels;
   a sealing member for sealing the plurality of pixels; and
   a sealing material for bonding the substrate and the sealing member;
   wherein each of the pixels comprises a thin film transistor disposed on the substrate, an organic electroluminance device including a lower electrode connected to the thin film transistor, a pixel isolation layer exposing a portion of the lower electrode, an organic layer formed on at least the exposed portion of the lower electrode, and an upper electrode;
   wherein the pixel isolation layer comprises a laminated structure of a lower layer and an upper layer;
   wherein the pad interconnection lines of the pad interconnection region are covered by a first insulating layer, and the pads of the pad region are covered by a second insulating layer so as to expose portions of the pads; and
   wherein the first insulating layer and the second insulating layer are formed of a same material as the lower layer of the pixel isolation layer.

2. The organic light emitting display device of claim 1, wherein the lower layer of the pixel isolation layer comprises an inorganic insulating layer.

3. The organic light emitting display device of claim 2, wherein the lower layer of the pixel isolation layer comprises a silicon nitride layer.

4. The organic light emitting display device of claim 1, wherein the upper layer of the pixel isolation layer comprises an organic insulating layer.

5. The organic light emitting display device of claim 4, wherein the upper layer of the pixel isolation layer comprises one of polyimide, polyamride, BCB and SOG.

6. The organic light emitting display device of claim 1, wherein the sealing material comprises one of a frit and a sealant.

7. The organic light emitting display device of claim 1, wherein the sealing material is disposed on a portion of the second insulating layer over the pad interconnection line in the pad interconnection region.

8. A method of fabricating an organic light emitting display device, the method comprising the steps of:
   preparing a substrate including a pixel region in which a plurality of pixels is arranged, a pad region, and a pad interconnection region;
   forming a thin film transistor in each of the pixels of the pixel region, forming a pad on the pad region, and forming a pad interconnection line on the pad interconnection region;
   forming a lower electrode connected to the thin film transistor on the pixel region;
   forming a pixel isolation layer including a first opening exposing a portion of the lower electrode on the pixel region, forming a first insulating layer on the pad interconnection region so as to insulate the pad interconnection line, and forming a second insulating layer including a second opening exposing a portion of the pad on the pad region so as to insulate the pad using a single mask process;

forming an organic layer on an exposed lower electrode of the pixel region;

forming an upper electrode on the pixel region; and sealing the plurality of pixels on the substrate by a sealing member using a sealing material;

wherein the pixel isolation layer comprises a laminated structure of a lower layer and an upper layer; and wherein the first insulating layer and the second insulating layer are formed of a same material as the lower layer of the pixel isolation layer.

9. The method of claim 8, wherein the lower layer comprises an inorganic insulating layer.

10. The method of claim 9, wherein the lower layer comprises a silicon nitride layer.

11. The method of claim 8, wherein the first and second insulating layers comprise an inorganic insulating layer.

12. The method of claim 11, wherein the first and second insulating layers comprise a silicon nitride layer.

13. The method of claim 8, wherein the upper layer of the pixel isolation layer comprises an organic insulating layer.

14. The method of claim 13, wherein the upper layer of the pixel isolation layer comprises one of polyimide, polyamide, BCB and SOG.

15. The method of claim 8, wherein the forming of the pixel isolation layer and the first and second insulating layers comprises:

forming a lower insulating layer and an upper insulating layer on the substrate;

forming a first upper insulating layer pattern including an opening on the pixel region, a second upper insulating layer pattern on the pad interconnection region, and a third upper insulating layer pattern including an opening on the pad region by patterning the upper insulating layer using a halftone mask;

forming a first lower insulating layer pattern having an opening on the pixel region to form the pixel isolation layer having the first opening including openings of the first upper and lower insulating layer patterns, a second lower insulating layer pattern on the pad interconnection region, and a third lower insulating layer pattern having the second opening on the pad region by etching the lower insulating layer using the first to third upper insulating layer patterns as a mask; and removing the second and third insulating layer patterns.

16. The method of claim 8, wherein a frit is coated on a portion of the pad interconnection region to seal the substrate and the sealing member.

* * * * *